United States Patent
Mulkens

(10) Patent No.: US 7,368,744 B2
(45) Date of Patent: May 6, 2008

(54) PHOTON SIEVE FOR OPTICAL SYSTEMS IN MICRO-LITHOGRAPHY

(75) Inventor: Johannes Catharinus Hubertus Mulkens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 165 days.

(21) Appl. No.: 11/356,324

(22) Filed: Feb. 17, 2006

(65) Prior Publication Data

US 2007/0194254 A1 Aug. 23, 2007

(51) Int. Cl.
*G21K 5/04* (2006.01)
*G01J 3/10* (2006.01)

(52) U.S. Cl. ............. 250/504 R; 250/365; 250/492.2; 250/492.22; 378/34; 378/35

(58) Field of Classification Search ............ None
See application file for complete search history.

(56) References Cited

U.S. PATENT DOCUMENTS 5,229,872 A 7/1993 Mumola
5,296,891 A 3/1994 Vogt et al.
5,523,193 A 6/1996 Nelson
6,894,292 B2 * 5/2005 Gil et al. ............. 250/492.2
7,160,673 B2 * 1/2007 Menon et al. ............. 430/321

FOREIGN PATENT DOCUMENTS

WO 98/33096 7/1998
WO 98/38597 9/1998

* cited by examiner

*Primary Examiner*—Nikita Wells
(74) *Attorney, Agent, or Firm*—Pillsbury Winthrop Shaw Pittman LLP

(57) ABSTRACT

The use of photon sieves may be as a pupil defining element in an illumination system; a field of defining elements in an illumination system; a pupil lens element in a projection lens; a color correction system in the projection system; or as a transmitting diffractive element for EUV.

27 Claims, 8 Drawing Sheets

PHOTON SIEVE FOR OPTICAL SYSTEMS IN MICRO-LITHOGRAPHY

BACKGROUND OF THE INVENTION

1. Field of the Invention

The present invention relates to an optical system in a lithographic apparatus and a method for manufacturing a device.

2. Description of the Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or other device). This pattern may be transferred on (part of) the substrate (e.g. a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may include a patterning array that includes an array of individually controllable elements. An advantage of such a system compared to a mask-based system is that the pattern can be changed more quickly and for less cost.

A flat panel display substrate may be rectangular in shape. Lithographic apparatus designed to expose a substrate of this type may provide an exposure region which covers a full width of the rectangular substrate, or which covers a portion of the width (for example half of the width). The substrate may be scanned underneath the exposure region, while the mask or reticle is synchronously scanned through the beam. In this way, the pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The aim of lithography is to achieve more and smaller patterns on substrates in order to make smaller devices such as ICs. A difficulty lies in focusing the radiation onto a patterning device, and then focusing the patterned radiation onto the increasingly small and more densely packed target area of the substrate. This is particularly difficult with short wavelength radiation such as X-rays, EUV or DUV (with typical wavelengths such as 248 or 193 nm), that cannot be focused enough using traditional lenses used for visible light and the like. Furthermore, there are several areas in lithography that require efficient and delicate focusing of radiation that traditional methods do not achieve. Traditionally, focusing elements have included glass lenses. However, glass lenses have a relatively large cross sectional and surface area and so the layout of glass lenses is limited. Furthermore, glass has a specific lifetime and may be prone to chipping or clouding. Furthermore, low wavelength radiation (such as X-rays) does not transmit or refract through glass.

SUMMARY OF THE INVENTION

Aspects of the invention include more efficiently and effectively focusing radiation onto a target area of a substrate in a lithographic apparatus.

In an embodiment, there is provided a lithographic apparatus including an illumination system configured to condition a radiation beam and a patterning device configured to modulate the cross-section of the radiation beam, wherein a pupil defining element in the illumination system includes a photon sieve.

In an embodiment, there is provided a lithographic apparatus including: an illumination system configured to condition a radiation beam and a patterning device configured to modulate the cross-section of the radiation beam, wherein a field defining element in the illumination system includes a photon sieve.

In an embodiment, there is provided a lithographic apparatus including an illumination system configured to condition a radiation beam; a patterning device configured to modulate the cross-section of the radiation beam; and a projection system configured to project the modulated radiation beam onto a target portion of a substrate, wherein a pupil lens element in the projection system includes a photon sieve.

In an embodiment, there is provided a device manufacturing method including projecting a modulated beam of radiation onto a substrate, wherein the radiation is modulated or shaped in an illumination system using a photon sieve. The radiation rays can be divergent as well as convergent using a photon sieve.

In an embodiment, there is provided a device manufacturing method including projecting a modulated beam of radiation onto a substrate, wherein the radiation is patterned using a patterning device and focused in a projection system using a photon sieve.

DETAILED DESCRIPTION

Figure 1:
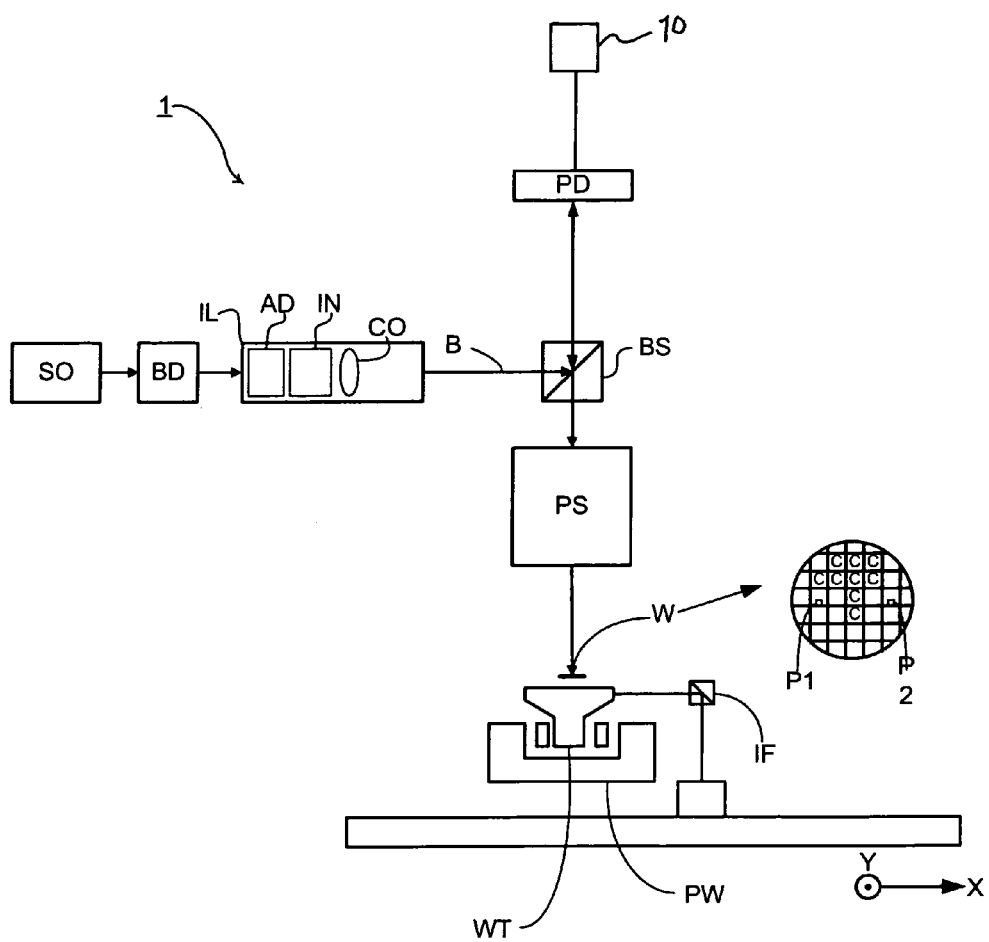
FIG. 1 depicts a lithographic apparatus according to an embodiment of the invention.
Figure 2:
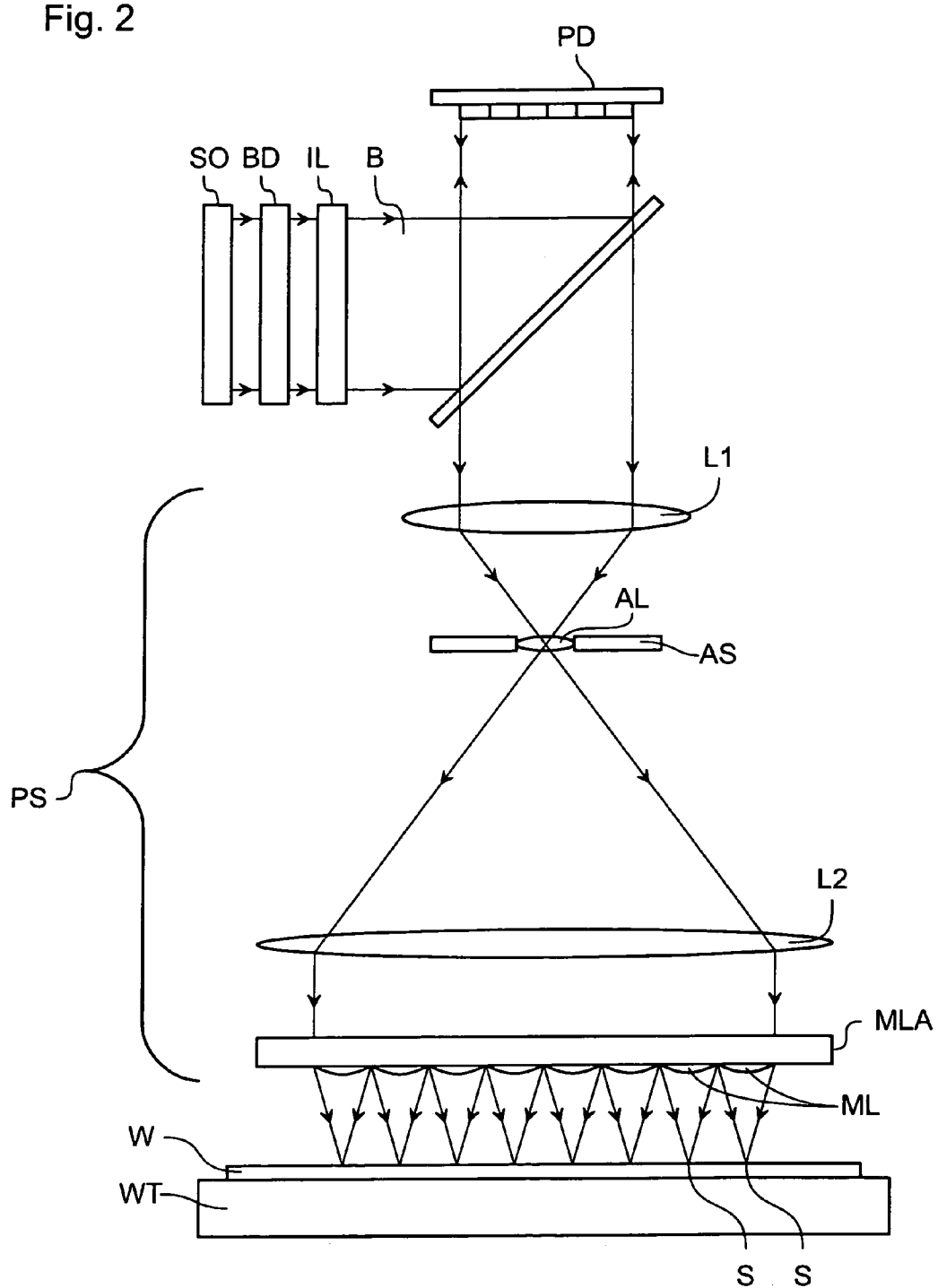
FIG. 2 depicts a lithographic apparatus according to another embodiment of the invention.

In an embodiment, the present invention provides a photon sieve provided as a pupil defining element or a field defining element in the illumination system IL of the apparatus as shown in FIGS. 1 and 2. In an alternative embodiment, there is provided a photon sieve in the projection system, acting as a pupil lens element. In an alternative embodiment, the pupil lens element in the shape of a photon sieve is used for color correction of the radiation beam being projected. As a further embodiment, the photon sieve may be used as a transmitting diffracting element for EUV radiation.

FIG. 1 schematically depicts a lithographic apparatus 1 according to an embodiment of the invention. The apparatus includes an illumination system (illuminator) IL configured to condition a radiation beam B (e.g. UV radiation). A patterning device PD (e.g. an array of individually controllable elements) that modulates the beam. In general, the position of the array of individually controllable elements will be fixed relative to the projection system ("lens") PS. However it may instead be connected to a positioner configured to accurately position the array of individually controllable elements in accordance with certain parameters. A substrate table WT is configured to support a substrate (e.g. a resist-coated substrate) W and is connected to a positioner PW configured to accurately position the substrate in accordance with certain parameters. The a projection system (e.g. a refractive projection lens system) PS is configured to project the beam of radiation modulated by the array of individually controllable elements onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The term "patterning device" as used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays. Patterning devices whose pattern is programmable with the aid of electronics (e.g., a computer), such as patterning devices including a plurality of programmable elements, that can each modulate the intensity of a portion of the radiation beam (e.g., all the devices mentioned in the previous sentence except for the reticle), are collectively referred to herein as "contrast devices." It should be appreciated that an electronically programmable patterning device having a plurality of programmable elements that impart a pattern to the radiation beam by modulating the phase of a portion of the radiation beam relative to adjacent portions of the radiation beam may also be used. In an embodiment, the patterning device includes at least 10 programmable elements, e.g. at least 100, at least 1000, at least 10000, at least 100000, at least 1000000, or at least 10000000 programmable elements. Embodiment of several of these devices are discussed in some more detail below:

A programmable mirror array. This may include a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the the undiffracted light can be filtered out of the reflected beam, leaving only the diffracted light to reach the substrate. In this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is included of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuators. Once again, the mirrors are matrix-addressable, such that addressed mirrors reflect an incoming radiation beam in a different direction to unaddressed mirrors. In this manner, the reflected beam may be patterned according to the addressing pattern of the matrix-addressable mirrors. The required matrix addressing may be performed using suitable electronics. More information on mirror arrays as here referred to can be gleaned, for example, from U.S. Pat. Nos. 5,296,891 and 5,523,193, and published PCT patent applications WO 98/38597 and WO 98/33096, which are incorporated herein by reference in their entirety.

A programmable LCD array is another example of a patterning device. An example of such a construction is given in U.S. Pat. No. 5,229,872, which is incorporated herein by reference in its entirety.

The lithographic apparatus may include one or more patterning devices. For example, it may have a plurality of arrays of individually controllable elements, each controlled independently of each other. In such an arrangement, some or all of the arrays of individually controllable elements may have at least one of a common illumination system (or part of an illumination system), a common support for the arrays of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment, the thickness is at least 50 μm, for instance at least 100 μm, at least 200 μm, at least 300 μm, at least 400 μm, at least 500 μm, or at least 600 μm In one embodiment, the thickness of the substrate is at most 5000 μm, for instance at most 3500 μm, at most 2500 μm, at most 1750 μm, at most 1250 μm, at most 1000 μm, at most 800 μm, at most 600 μm, at most 500 μm, at most 400 μm, or at most 300 μm. The substrate referred to herein may be processed, before or after exposure, in for example a track (a tool that typically applies a layer of resist to a substrate and develops the exposed resist), a metrology tool and/or an inspection tool.

In an embodiment, a resist layer is provided on the substrate. In an embodiment, the substrate W is a wafer, for instance a semiconductor wafer. In an embodiment, the wafer material is selected from the group of Si, SiGe, SiGeC, SiC, Ge, GaAs, InP, and/or InAs. In one embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate. Alternatively, the projection system may image secondary sources for which the elements of the array of individually controllable elements act as shutters. In this respect, the projection system may include an array of focusing elements such as a micro lens array (MLA) or a Fresnel lens array, for example to form the secondary sources and to image spots onto the substrate. In an embodiment, the array of focusing elements (e.g. MLA) includes at least 10 focus elements, e.g. at least 100 focus elements, at least 1000 focus elements, at least 10000 focus elements, at least 100000 focus elements, or at least 1000000 focus elements. In an embodiment, the number of individually controllable elements in the patterning device is equal to or greater than the number of focusing elements in the array of focusing elements. In an embodiment, the array of focusing elements includes a focusing element that is optically associated with one or more of the individually controllable elements in the array of individually controllable elements, e.g. with two or more of the individually controllable elements in the array of individually controllable elements, such as three or more, five or more, ten or more, twenty or more, twenty five or more, thirty five or more, or fifty or more. In an embodiment, the array of focusing elements includes more than one focusing element (e.g. more than 1000, the majority, or about all) that is optically associated with one or more of the individually controllable elements in the array of individually controllable elements. In an embodiment, the MLA is movable (e.g. with the use of actuators) at least in the direction to and away from the substrate, e.g. with the use of one or more actuators. Being able to move the MLA to and away from the substrate allows, for example, focus adjustment without having to move the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index. e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment. the radiation has a wavelength including 436 nm, 405 nm, 365 nm, 355 nm, 248 nm, 193 nm, 157 nm, and/or 126 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is included of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B. Where used, the positioning means for the array of individually controllable elements can be used to correct accurately the position of the patterning device PD with respect to the path of the beam B, for example during a scan. In an embodiment, movement of the substrate table WT is realized with the aid of a long-stroke module (coarse positioning) and a short-stroke module (fine positioning), which are not explicitly depicted in FIG. 1. In an embodiment, the apparatus is absent at least a short stroke module for moving substrate table WT. A similar system may also be used to position the array of individually controllable elements. It will be appreciated that the beam B may alternatively/additionally be moveable while the object table and/or the array of individually controllable elements may have a fixed position to provide the required relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g. between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in four preferred modes:

1. In step mode, the array of individually controllable elements and the substrate are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.
4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a pattern is exposed on a layer of resist on the substrate. The resist is then developed. Subsequently, additional processes steps are performed on the substrate. The effect of these subsequent processes on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling".

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, eg. at least 4 radiation intensity values, at least 8 radiation intensity values, at least 16 radiation intensity values, at least 32 radiation intensity values, at least 64 radiation intensity values, at least 128 radiation intensity values or at least 256 radiation intensity values.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least two desired dose levels, e.g. at least three desired radiation dose levels, at least four desired radiation dose levels, at least 6 desired radiation dose levels or at least eight desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of the point. As a further example, each point on the substrate may potentially receive radiation in a plurality of successive exposures. The radiation dose received by each point may, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore control signals, representing the requisite states, must be transmitted to each of the individually controllable elements. The lithographic apparatus 1 may include a controller 10 that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a process on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that may be used, for example, in the manufacture of flat panel displays. Components corresponding to those shown in FIG. 1 are depicted with the same reference numerals. Also, the above descriptions of the various embodiments, e.g. the various configurations of the substrate, the contrast device, the MLA, the beam of radiation, etc., remain applicable.

As shown in FIG. 2 the projection system PS includes a beam expander, which includes two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further includes an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point that lies on the substrate W. In this way an array of radiation spots S is exposed onto the substrate W. It will be appreciated that, although only eight lenses ML of the illustrated array of lenses MLA are shown, the array of lenses may include many thousands of lenses (the same is true of the array of individually controllable elements used as the patterning device PD).

Figure 3:
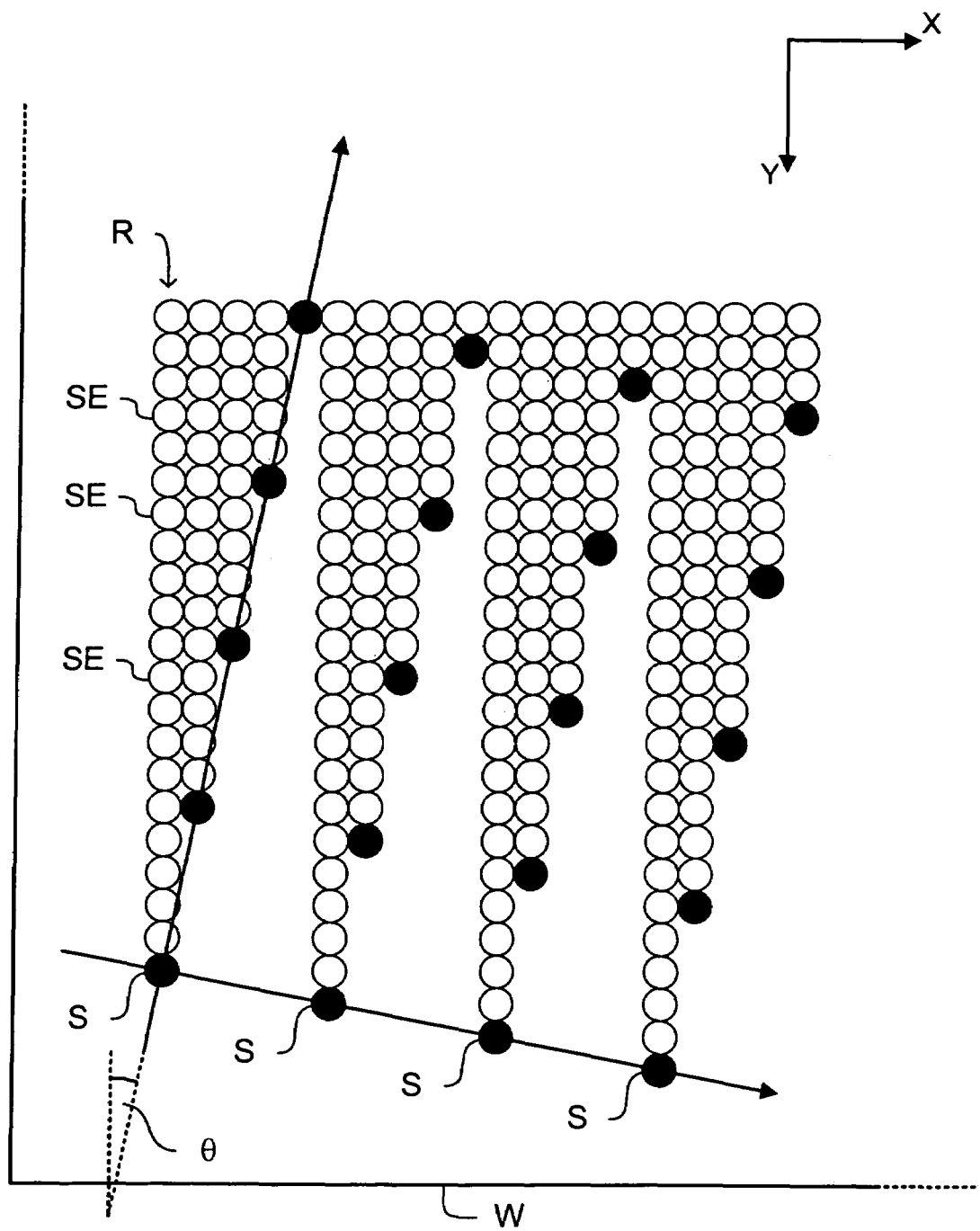
FIG. 3 depicts a mode of transferring a pattern to a substrate using an embodiment of the invention as show in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging."

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle θ is at most 20°, 10°, for instance at most 5°, at most 3°, at most 1°, at most 0.5°, at most 0.25°, at most 0.10°, at most 0.05°, or at most 0.01°. In an embodiment, the angle θ is at least 0.0001°.

Figure 4:
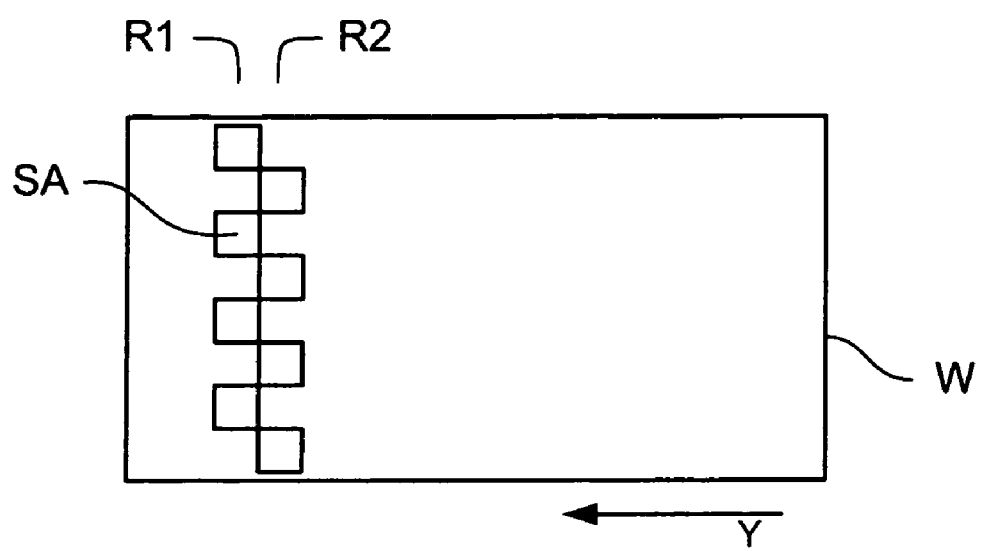
FIG. 4 depicts an arrangement of optical engines.

FIG. 4 shows schematically how the entire flat panel display substrate W may be exposed in a single scan, by using a plurality of optical engines. Eight arrays SA of radiation spots S are produced by eight optical engines (not shown), arranged in two rows R1, R2 in a 'chess board' configuration such that the edge of one array of radiation spots S slightly overlaps (in the scanning direction Y) with the edge of the adjacent array of radiation spots S. In an embodiment, the optical engines are arranged in at least three rows, for instance four rows or five rows. In this way, a band of radiation extends across the width of the substrate W, allowing exposure of the entire substrate to be performed in a single scan. It will be appreciated that any suitable number of optical engines may be used. In an embodiment, the number of optical engines is at least one, for instance at least two, at least four, at least eight, at least 10, at least twelve, at least fourteen, or at least seventeen. In an embodiment, the number of optical engines is less than forty, e.g. less than thirty or less than twenty.

Each optical engine may include a separate illumination system IL, patterning device PD and projection system PS as described above. It is to be appreciated, however, that two or more optical engines may share at least a part of one or more of the illumination system, patterning device and projection system.

There are several positions in the apparatus in which the radiation beam needs to be focused. Not only this, but the focusing needs to be sharp, with as little "blurring around the edges" as possible. These positions may be: a pupil defining element in the illumination system IL; a-field defining element in the illumination system IL; a lens element for EUV; a pupil lens element in the projection system PS; or for color correction in the projection system PS.

Figure 5A:
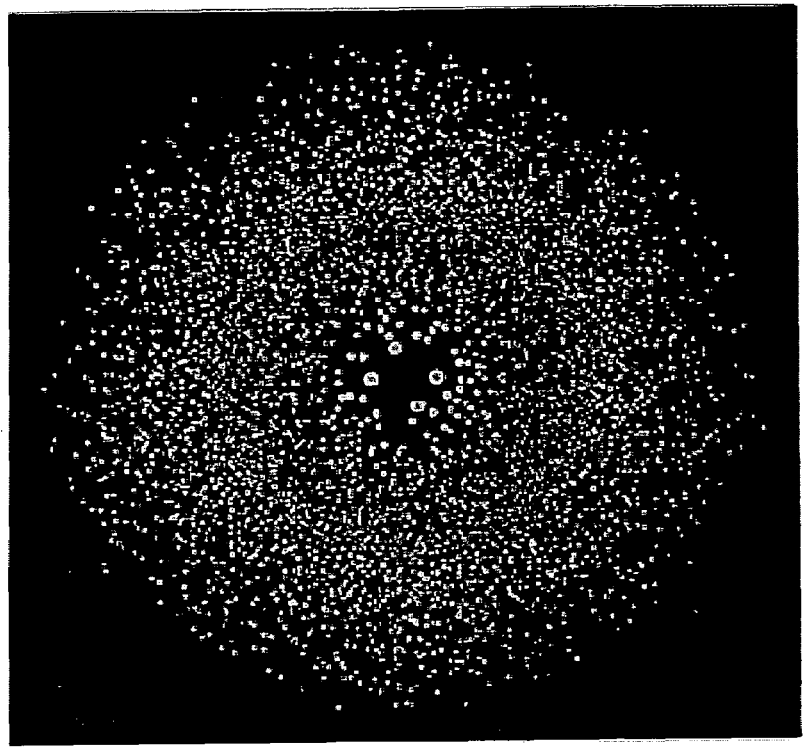
FIGS. 5a and 5b depict a photon sieve according to an aspect of the invention.

FIG. 5a shows an embodiment of a photon sieve. The photon sieve is frequently compared to a zone plate (e.g. a Fresnel Zone plate) with its transmissive and opaque concentric rings, but performs better and in principle is different. The photon sieve consists of a large number of appropriately, pseudo-randomly distributed pinholes instead of the rings as the diffracting elements. To obtain a distinct first-order focus, the pinholes have to be positioned such that the optical path length from the source via the sensor of the pinholes to the focal point is an integral number of wavelengths (see, for example, FIG. 5b). The diameter of the pinholes is not limited by the width of the corresponding Fresnel zones. This allows pinholes to be positioned on Fresnel zones that are narrower than the fabrication limit (20-40 nm) and the spacial resolution of the optical element may be better than 10 nm. This is because light from all parts of the pinhole interferes constructively at the focus. Pinholes with diameters larger than the width of the underlying zone can also be used. Such holes transmit contributions that partially compensate; as long as the "white" areas (areas of constructive superposition) dominate, there is a net positive contribution to the focus. The sizes of the pinholes can therefore be chosen to give different diffraction maxima and combining pinholes with different maxima allows mixed-order photon sieves to be configured (with effectively the same effect as composite zone plates with combined orders of diffraction).

Figure 5B:
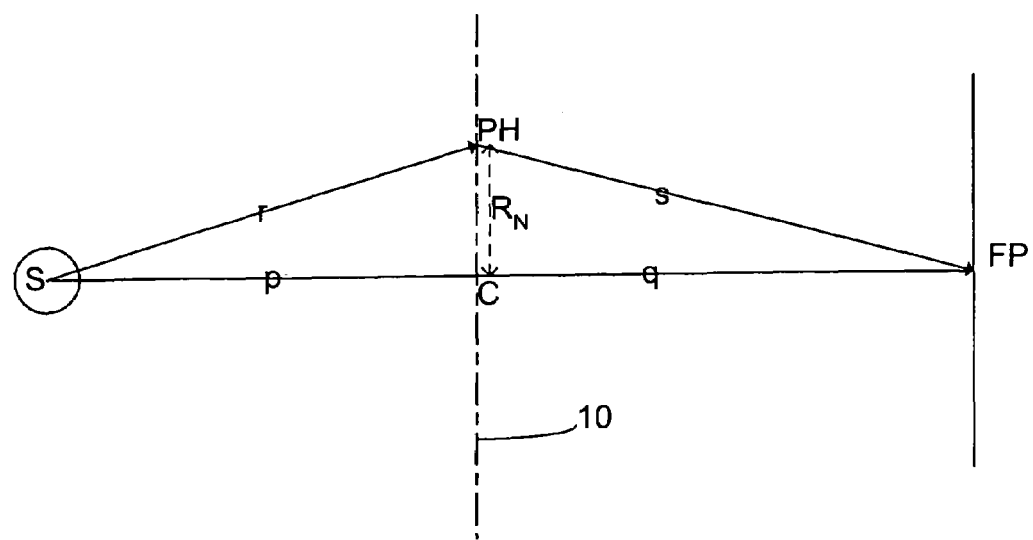

FIG. 5b shows a side view of a photon sieve 10 and the method of calculating the distance $R_N$ of a pinhole in the photon sieve from the pinhole PH from the center C of the photon sieve 10. The distance between the source S and the focal point FP of the photon sieve 10 is p+q through the center C of the photon sieve. The optical path lengths via the center of the pinhole PH should be an integral number of wavelengths. In other words, $n\lambda = r+s$ = optical path of the radiation. It is known that $r^2 = p^2 + R_N^2$ and $s^2 = q^2 + R_N^2$. Therefore, $n\lambda = \sqrt{(q^2+R_N^2)} + \sqrt{(q^2+R_N^2)}$.

The distance $R_N$ from the center C of the photon sieve to the pinhole PH may therefore be determined and the pinhole drilled appropriately.

Figure 6:
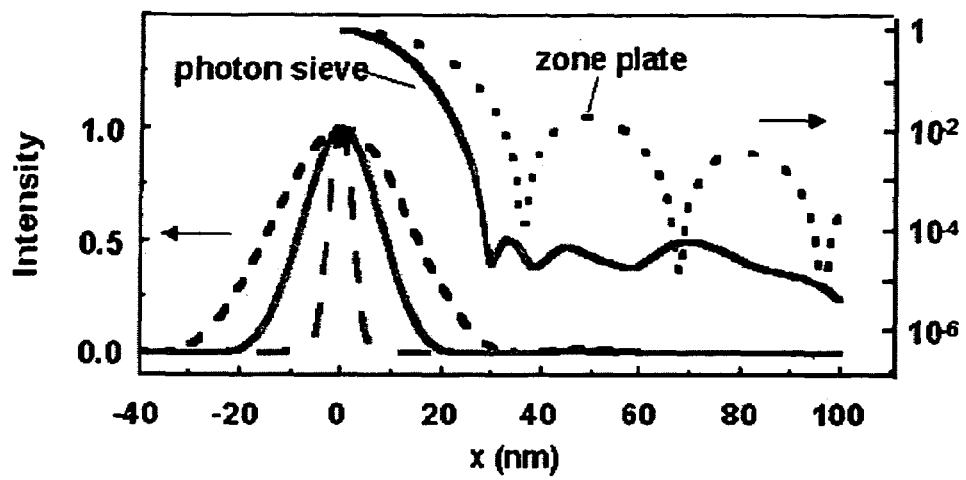
FIG. 6 depicts a graph comparing the diffractive properties of a fresnel Zone plate and a photon sieve.

FIG. 6 shows the behavior of the radiation in a photon sieve (dotted lines) compared with that in a zone plate (solid and dashed lines). The focal spot produced by a Fresnel zone plate is surrounded by rings of intensity, shown by the dotted line in FIG. 6, as secondary maxima that are prone to blurring the images. For a Fresnel zone plate, each ring contributes equally to the amplitude at the focus, causing this blur. With a photon sieve, on the other hand, the number of pinholes per ring can be readily adjusted to yield a smooth transmission, which minimizes a secondary maxima as shown by the solid line in FIG. 6. This provides a sharper image as shown in the bottom graph. The intensity on the y-axis is compared with the image size on the x-axis. FIG. 6 shows the result with use of X-ray radiation.

One benefit of using a photon sieve over a zone plate or glass lens, other than that X-rays are not focused by glass lenses, is that the photon sieve is a non-glass monolithic optical element such as a metal foil with pinholes etched or laser beam drilled in it. It is usable for all wavelengths, including EUV and does not suffer from photon-induced damage, as glass may be.

There is low scattering in photon sieves compared to zone plates which maintains the contrast of the optical system.

Photon sieves are thin and light and have high diffractive (or optical) power. By high diffractive power, it is meant that the range in angle of the radiation rays hitting the photon sieve may be large. Similarly to curved glass lenses, the angle may be up to several degrees. Photon sieves are good at filtering out higher diffraction orders, which can blur an image. Photon sieves are relatively easy to manufacture and their low weight means that they can be accelerated and decelerated easily which gives a fast exchange time when required. A photon sieve may be used for both a refractive and a reflected system (i.e. when the patterning device is refracted or reflected as discussed elsewhere). A large number of pinholes can increase transmission to more than 50% transmission. The grouping of the pinholes, for example, into concentric circles, can improve the optical performances of the photon sieve.

Figure 7:
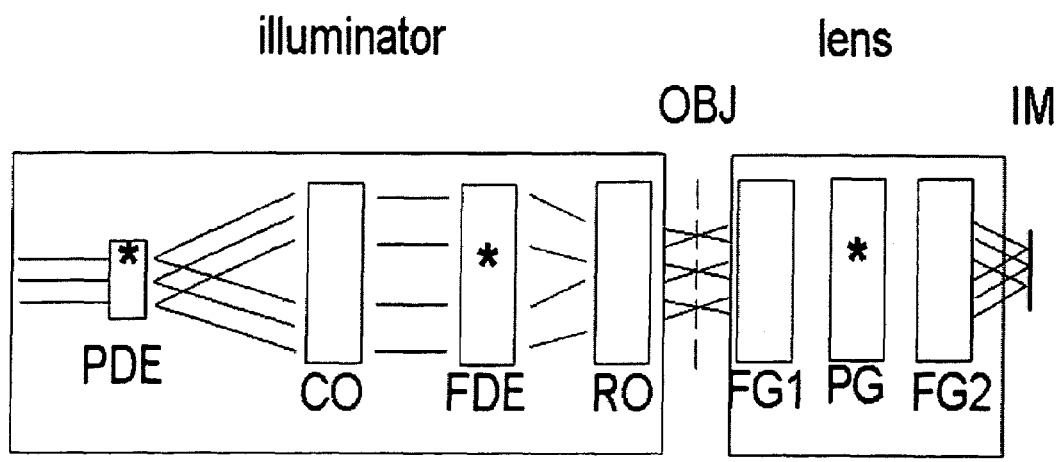
FIG. 7 depicts the use of a photon sieve according to an embodiment of the invention.

There are several possible positions for a photon sieve, as shown in FIG. 7. FIG. 7 shows an illuminator and a lens, with the object OBJ between them and the image IM of the object on the side of the lens distal from the illuminator. The illuminator contains a pupil-defining element PDE, collimating optics CO, a field-defining element FDE and relay optics RO. The possible positions for the photon sieve are shown with asterisks *; i.e. there may be a photon sieve as a pupil-defining element or a field-defining element. The lens contains a first and second field group FG1, FG2 surrounding a pupil group PG. The pupil group may include a photon sieve.

Figure 8:
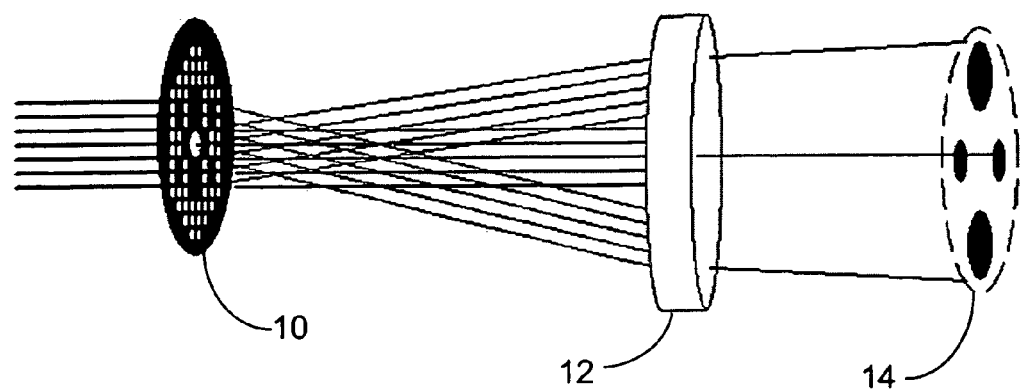
FIG. 8 depicts the use of a photon sieve according to an embodiment of the invention.

One of the embodiments shown in FIG. 7 includes the photon sieve being used as a pupil-defining element 10. This specific embodiment is shown in FIG. 8. A photon sieve 10 is used as a pupil-defining element (i.e. as a diffractive optical element that creates an illumination pupil). The dimensions and distribution of the photon sieve's pinholes may be matched with the required pupil. The diffraction pattern created by the photon sieve creates a far field pattern that matches the required illumination pupil pattern. This pupil pattern then impinges on a lens 12 to create the illumination pattern 14 required. In the embodiment shown in FIG. 8, the pinhole configuration creates a "C-Quad" illumination pattern 114. Other patterns may be created such as quasar, dipole, annular, etc., by using different dimensions and distributions of pinholes in the photon sieve 10.

Figure 9:
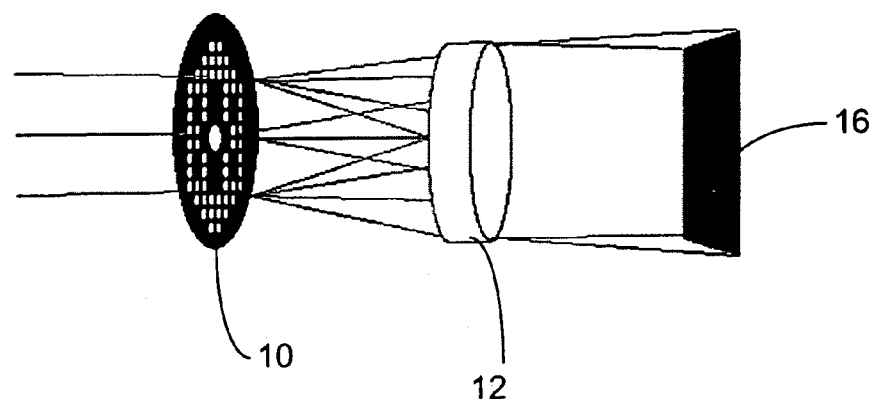
FIG. 9 depicts the use of a photon sieve according to an embodiment of the invention.

An alternative embodiment, a photon sieve may be used as a field-defining element. This embodiment is shown in more detail in FIG. 9. The photon sieve 10 is used as a diffractive optical element that creates an illumination field, rather than a specific pattern. In this case, the dimensions and distribution of the pinholes determine the shape of the illumination field. The embodiment shown in FIG. 9 is a rectangular field, the diffracted radiation from the photon sieve having first passed through a field lens 12.

Figure 10:
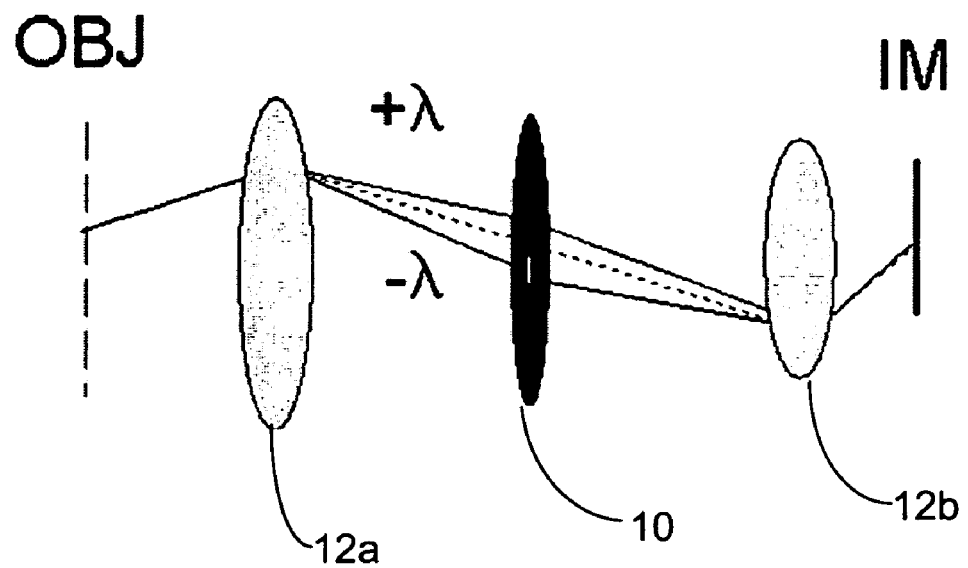
FIG. 10 depicts the use of a photon sieve according to an embodiment of the invention.

In the lens system shown in FIG. 7, the photon sieve 10 may be used as a pupil element for color correction. This is shown in more detail in FIG. 10. Color correction may be carried out by the combination of an optical (glass) element 12a, 12b that has negative dispersion (dn/dλ<0) with a diffractive optical element 10 that has a positive dispersion (dn/dλ>0). Photon sieves have positive dispersion and so may be combined with lenses such as 12a and 12b to allow color correction of an illumination beam. To ensure a field constant color correction, the preferred position of the photon sieve is the pupil of the projection lens; i.e. between the object and the image as shown in FIG. 10.

As well as being used alongside lenses, photon sieves may be used in mirror optic systems. One embodiment of this use is using a photon sieve as a transmitting diffractive lens element for EUV. With current methods, because EUV does not penetrate (or get diffracted by) glass lenses, EUV can only work with mirror optics. The layout and ray obstruction problem with mirror optics makes it difficult to design very high numerical aperture lenses. However, with a photon sieve, it is possible to include transmitting lens elements in EUV lens and illuminated designs. This improves the layout of a projection system.

Although specific reference may be made in this text to the use of lithographic apparatus in the manufacture of a specific device (e.g. an integrated circuit or a flat panel display), it should be appreciated that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it should be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A lithographic apparatus, comprising:
    an illumination system configured to condition a radiation beam; and
    a patterning device configured to modulate the cross-section of the radiation beam, wherein a pupil-defining element in the illumination system comprises a photon sieve.

2. A lithographic apparatus according to claim 1, wherein the photon sieve comprises a number of holes such that transmission of the radiation beam is between 30 and 70%.

3. A lithographic apparatus according to claim 1, wherein the photon sieve comprises holes in concentric circular zones.

4. A lithographic apparatus according to claim 3, wherein the photon sieve comprises two different overlapping patterns of circular zones.

5. A lithographic apparatus according to claim 1, wherein the photon sieve comprises holes positioned such that the optical path length from an illumination system source to the focal point of the photon sieve is a whole number of wavelengths of the radiation beam.

6. A lithographic apparatus according to claim 1, wherein the photon sieve is made of metal foil and holes in the photon sieve are etched or laser beam drilled.

7. A lithographic apparatus, comprising:
    an illumination system configured to condition a radiation beam;
    a patterning device configured to modulate the cross-section of the radiation beam, wherein a field-defining element in the illumination system comprises a photon sieve.

8. A lithographic apparatus according to claim 7, wherein the photon sieve comprises a number of holes such that transmission of the radiation beam is at least 50%.

9. A lithographic apparatus according to claim 7, wherein the photon sieve comprises holes in concentric circular zones.

10. A lithographic apparatus according to claim 9, wherein the photon sieve comprises two different overlapping patterns of circular zones of holes.

11. A lithographic apparatus according to claim 7, wherein the photon sieve comprises holes positioned such that the optical path length from an illumination system source to the focal point of the photon sieve is a whole number of wavelengths of the radiation beam.

12. A lithographic apparatus according to claim 7, wherein the photon sieve is made of metal foil and holes in the photon sieve are etched or laser beam drilled.

13. A lithographic apparatus, comprising:
   an illumination system configured to condition a radiation beam;
   a patterning device configured to modulate the cross-section of the radiation beam; and
   a projection system, comprising a pupil lens element, configured to project the modulated radiation beam onto a target portion of a substrate, wherein the pupil lens element in the projection system comprises a photon sieve.

14. A lithographic apparatus according to claim 13, wherein the pupil lens element has positive dispersion and is combined with a lens with negative dispersion for color correction of the radiation beam.

15. A lithographic apparatus according to claim 13, wherein the photon sieve comprises a number of holes such that transmission of the radiation beam is at least 50%.

16. A lithographic apparatus according to claim 13, wherein the photon sieve comprises holes in concentric circular zones.

17. A lithographic apparatus according to claim 16, wherein the photon sieve comprises two different overlapping patterns of circular zones of holes.

18. A lithographic apparatus according to claim 13, wherein the photon sieve comprises holes positioned such that the optical path length from an illumination system source to the focal point of the photon sieve is a whole number of wavelengths of the radiation beam.

19. A lithographic apparatus according to claim 13, wherein the photon sieve is made of metal foil and holes in the photon sieve are etched or laser beam drilled.

20. A lithographic apparatus, comprising:
   an illumination system configured to condition an EUV radiation beam;
   a patterning device configured to modulate the cross-section of the EUV radiation beam; and
   a projection system, comprising a pupil lens element, configured to project the modulated radiation beam onto a target portion of a substrate, wherein the illumination system or the projection system comprises mirror optics and a photon sieve.

21. A lithographic apparatus according to claim 20, wherein the photon sieve comprises a number of holes such that transmission of the radiation beam is at least 50%.

22. A lithographic apparatus according to claim 20, wherein the photon sieve comprises holes in concentric circular zones.

23. A lithographic apparatus according to claim 22, wherein the photon sieve comprises two different overlapping patterns of circular zones of holes.

24. A lithographic apparatus according to claim 20, wherein the photon sieve comprises holes positioned such that the optical path length from an illumination system source to the focal point of the photon sieve is a whole number of wavelengths of the radiation beam.

25. A lithographic apparatus according to claim 20, wherein the photon sieve is made of metal foil and holes in the photon sieve are etched or laser beam drilled.

26. A device manufacturing method comprising projecting a modulated beam of radiation onto a substrate, wherein the radiation is diffracted in an illumination system using a photon sieve.

27. A device manufacturing method comprising projecting a modulated beam of radiation onto a substrate, wherein the radiation is patterned using a patterning device and focused in a projection system using a photon sieve.

* * * * *